(12) United States Patent
Kim et al.

(10) Patent No.: US 6,876,252 B2
(45) Date of Patent: Apr. 5, 2005

(54) NON-ABRUPT SWITCHING OF SLEEP TRANSISTOR OF POWER GATE STRUCTURE

(75) Inventors: Suhwan Kim, Nanuet, NY (US); Daniel R. Knebel, Mahopac, NY (US); Stephen V. Kosonocky, Wilton, CT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/609,360

(22) Filed: Jun. 28, 2003

(65) Prior Publication Data

US 2004/0263237 A1 Dec. 30, 2004

(51) Int. Cl.[7] ............................................. H03K 17/72
(52) U.S. Cl. ............................................ 327/544
(58) Field of Search ........................... 327/530, 534, 327/535, 564, 565, 566, 544

(56) References Cited

U.S. PATENT DOCUMENTS

| | | | | |
|---|---|---|---|---|
| 5,880,604 A | * | 3/1999 | Kawahara et al. | 326/83 |
| 6,118,328 A | * | 9/2000 | Morikawa | 327/534 |
| 6,175,251 B1 | * | 1/2001 | Horiguchi et al. | 326/83 |
| 6,624,687 B1 | * | 9/2003 | Burr | 327/546 |

* cited by examiner

Primary Examiner—Jeffrey Zweizig
(74) Attorney, Agent, or Firm—Louis J. Percello; F. Chau & Associates, LLC (57) ABSTRACT

A semiconductor integrated circuit including a non-abrupt switching mechanism for a sleep transistor of a power gate structure to reduce ground bounce is provided. The semiconductor integrated circuit comprises a supply voltage line; a ground voltage line; a virtual ground voltage line; a logic circuit coupled to the supply voltage line and the virtual ground voltage line; at least one sleep transistor for controlling current flow to the logic circuit, the sleep transistor being coupled to the virtual ground voltage line and the ground voltage line; and a non-abrupt switching circuit for sequentially controlling the sleep transistor. The switching mechanism reduces the magnitude of voltage glitches on the power and ground rails as well as the minimum time required to stabilize power and ground.

17 Claims, 6 Drawing Sheets

NON-ABRUPT SWITCHING OF SLEEP TRANSISTOR OF POWER GATE STRUCTURE

BACKGROUND OF THE INVENTION

1. Field of the Invention

The present invention relates generally to semiconductor integrated circuit design, and more particularly, to a non-abrupt switching mechanism for a sleep transistor of a power gate structure for reducing ground bounce.

2. Description of the Related Art

As the number of devices being packed into a system-on-a-chip (SoC) approaches millions, power consumption has become a critical design concern due to the increasing gap between the energy required by portable computation/communication devices and the energy supplied by the battery. Traditionally, the primary source of power consumption for a CMOS design comes from the switching of logic states. The switching power is expressed as $$P_{switch} = a0 \rightarrow 1 \cdot f_{clk}(C_{load} \cdot V_{dd}^2)$$

where $0 \rightarrow 1$ is the average number of times in a clock cycle that a switch from 0 to 1 occurs, $f_{clk}$ is the clock frequency, $C_{load}$ is the load capacitance and $V_{dd}$ is the supply voltage. The equation clearly shows that supply voltage affects power dissipation in a quadratic order. Thus, voltage scaling has been deemed the most effective approach for dynamic power reduction. Reducing $V_{dd}$ alone, however, causes serious circuit performance degradation. One way to maintain performance is to scale down both $V_{dd}$ and the threshold voltage $V^{th}$ of logic transistors. Reducing $V^{th}$, however, exponentially increases subthreshold leakage current. This problem escalates in deep-submicron (DSM) technologies. Managing leakage current has become an integral part of overall power management.

Figure 1:
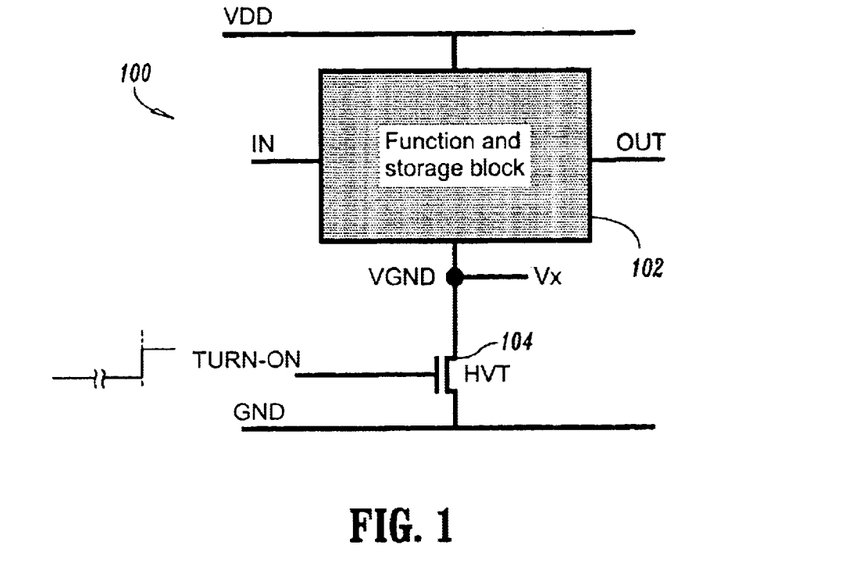
FIG. 1 is schematic diagram of a multi-threshold CMOS circuit including a power gate structure.

Referring to FIG. 1, a multi-threshold CMOS (MTCMOS) circuit 100, including a "power gate structure," is one of the well-known techniques to reduce leakage power in the standby mode while maintaining high speed in the active mode. The logic gates of a function and storage block 102 of the MTCMOS circuit 100 are implemented using low threshold voltage (LVT) transistors and are sinked to a virtual ground rail (VGND). VGND is linked to the ground rail (GND) through a high threshold voltage (HVT) transistor, called a sleep transistor 104. The sleep transistor 104 is controlled by a TURN-ON signal used for active/standby mode control.

Figure 2:
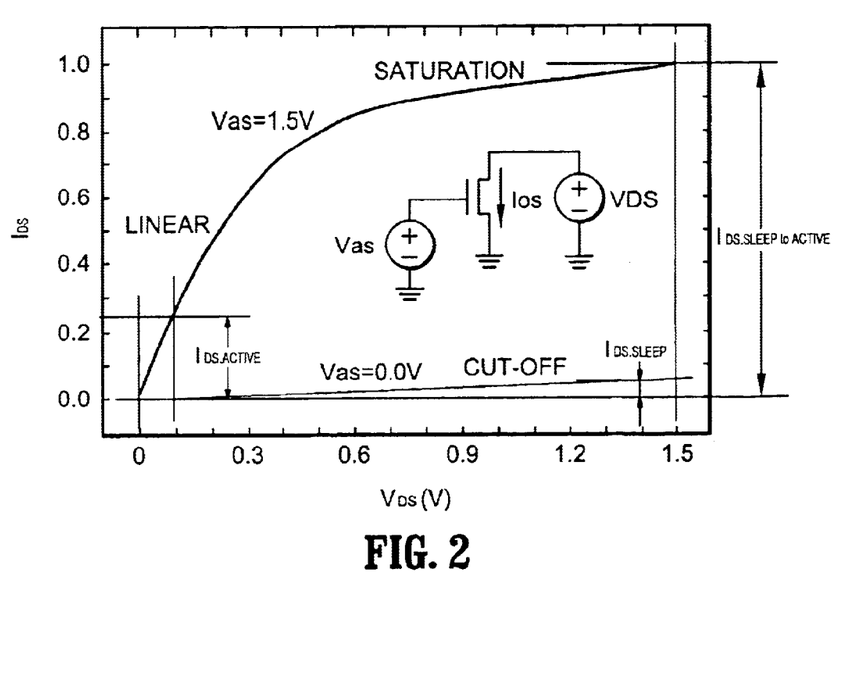
FIG. 2 is a graph illustrating I–V characteristics for the sleep transistor shown in FIG. 1.
Figure 3A:
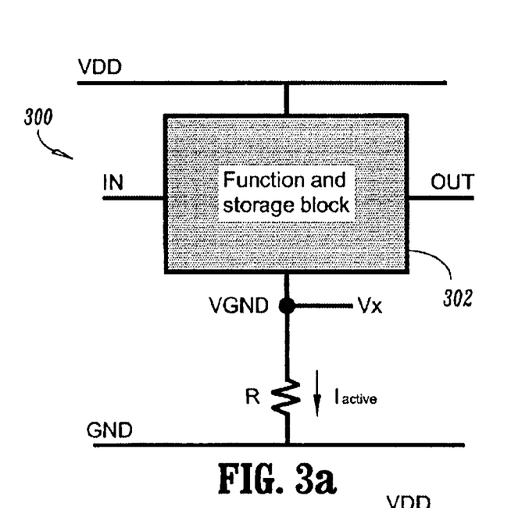
FIGS. 3(a)–(c) illustrate the sleep transistor modeled as a resistor in FIG. 3(a), an opened switch in FIG. 3(b), and a practical current source in FIG. 3(c)
Figure 3B:
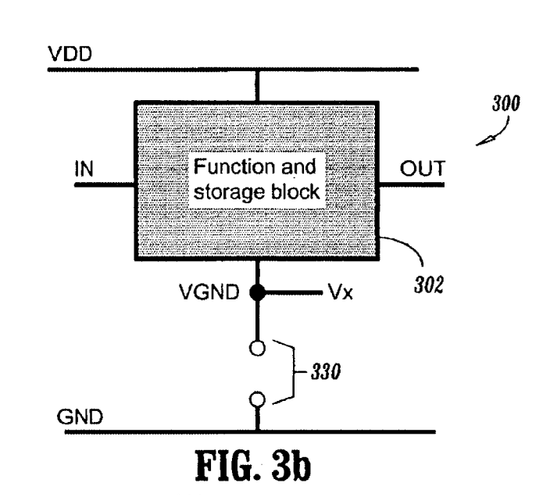
Figure 3C:
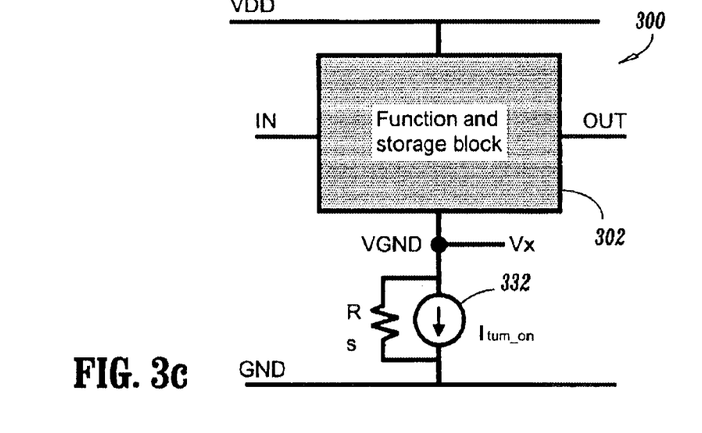

The ground bounce due to switching of a sleep transistor on a power gate structure is analyzed with reference to FIGS. 1–3, where FIG. 2 is a graph illustrating the I–V characteristics for a NMOS sleep transistor operated in linear, saturation and cut-off modes and FIG. 3 illustrates a sleep transistor in a power gate structure modeled as (a) a resistor, (b) an opened switch and (c) a practical current source. The problem caused by the ground bounce will also be described.

During the active mode, the sleep transistor 104 of the power gate structure 100 in FIG. 1 operates in its linear region of FIG. 2. The sleep transistor may be modeled as a resistor R as shown in FIG. 3(a). Here, the sleep transistor generates a small voltage drop $V_x$ equal to $I_{active} \times R$, where $I_{active}$ is the total current demand of the logic block 302 operating in active mode. In DSM technologies, the supply voltage is scaled down aggressively, causing the resistance of the sleep transistor to increase dramatically, requiring larger size sleep device.

In standby mode, the sleep transistor operates in the cutoff region of FIG. 2 and may be modeled as an opened switch 330 as shown in FIG. 3(b). During this mode, the leakage current is limited by the sleep transistor, which is reduced by a high threshold and a proportionally smaller width. By turning off the sleep transistor during the sleep period, the VGND rail is charged up to a steady state value near VDD.

As the sleep transistor is turned on, charge trapped in capacitive loads of the logic block 302 and virtual ground rail VGND begins to discharge through the sleep transistor. Initially, the sleep transistor operates in the saturation region of FIG. 2 and may be modeled as a practical current source 332 as shown in FIG. 3(c). The amount of current that can flow through the sleep transistor at this moment is much larger than the active mode current, $I_{active}$.

Figure 4:
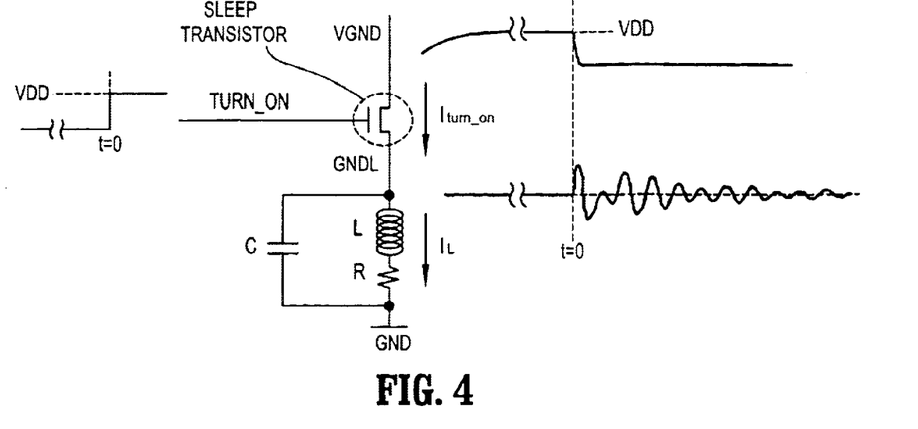
FIG. 4 illustrates switching noise within a ground rail due to power mode transition of a power gate structure.

FIG. 4 shows that the instantaneous current creates inductively induced voltage fluctuation in the VDD and GND rails. L, C, and R are the parasitic inductance, capacitance, and resistance of the GND rail, respectively.

Ground bounce, also known as simultaneous switching noise (SSN), is a voltage glitch induced in supply distributions due to changing currents passing through either wire/substrate inductance or package lead inductance associated with power or ground rails. These voltage glitches or surge/droop phenomena increase when larger current changes occur in a shorter period of time, which is a feature of turning on the sleep transistor. If the magnitude of this voltage surge/drop is greater than the noise margin of a circuit, the circuit may erroneously latch the wrong value or switch at the wrong time.

In previous technologies, switching of input/output buffers and internal circuitry were the primary sources of ground bounce. In designs employing a power gate structure to control leakage power, however, ground bounce due to switching of the sleep transistor is a potential problem. Also, lower supply voltages reduce noise immunity and threshold voltage, which create greater noise sensitivity.

SUMMARY OF THE INVENTION

A semiconductor integrated circuit including a non-abrupt switching mechanism for a sleep transistor of a power gate structure to reduce ground bounce is described. The switching mechanism reduces the magnitude of voltage glitches on the power and ground rails as well as the minimum time required to stabilize power and ground.

According to one aspect of the present invention, a semiconductor integrated circuit is provided including a supply voltage line; a ground voltage line; a virtual ground voltage line; a logic circuit coupled to the supply voltage line and the virtual ground voltage line; at least one sleep transistor for controlling current flow to the logic circuit, the sleep transistor being coupled to the virtual ground voltage line and the ground voltage line; and a switching circuit for controlling the sleep transistor over a period of time.

In another aspect of the present invention, the semiconductor integrated circuit further comprising a plurality of sleep transistors, wherein the switching circuit includes a plurality of delay elements, each delay element corresponding to each sleep transistor. Furthermore, the switching circuit may be a shift register having a plurality of outputs corresponding to each of the sleep transistors.

In a further aspect of the present invention, the switching circuit is a pulse generator.

In yet another aspect of the present invention, the switching circuit includes a resistor and capacitor connected in parallel.

In a still further aspect of the present invention, the switching circuit is a digital-to-analog converter.

In another aspect of the present invention, the switching circuit is a current mirror.

According to another aspect of the present invention, in a semiconductor integrated circuit including a supply voltage line, a ground voltage line, a virtual ground voltage line, a logic circuit coupled to the supply voltage line and the virtual ground voltage line, a method for controlling current flow to the logic circuit during an active and standby mode is provided, the method comprising the steps of providing a sleep transistor coupled to the virtual ground voltage line and the ground voltage line for controlling current flow to the logic circuit; and controlling the sleep transistor over a period of time to non-abruptly set the logic circuit to the active mode.

BRIEF DESCRIPTION OF THE DRAWINGS

The above and other aspects, features, and advantages of the present invention will become more apparent in light of the following detailed description when taken in conjunction with the accompanying drawings in which.

DETAILED DESCRIPTION OF PREFERRED EMBODIMENTS

Preferred embodiments of the present invention will be described hereinbelow with reference to the accompanying drawings. In the following description, well-known functions or constructions are not described in detail to avoid obscuring the invention in unnecessary detail.

A novel turn-on mechanism, e.g., a non-abrupt switching mechanism, of a sleep transistor on a power gate structure is provided to implement ground bounce reduction techniques. The turn-on mechanism according to embodiments of the present invention reduces the magnitude of voltage variation in a supply voltage VDD and ground voltage GND, as well as the time required to stabilized them. The turn-on mechanism of the present invention is implemented either by dynamically controlling the gate-to-source voltage, $V_{GS}$, of a sleep transistor or by turning on only a small portion of the sleep transistor at one time, in constrast to a conventional turn-on mechanism which instantaneously turns on an entire portion of the sleep transistor with a rail to rail voltage.

Figure 5:
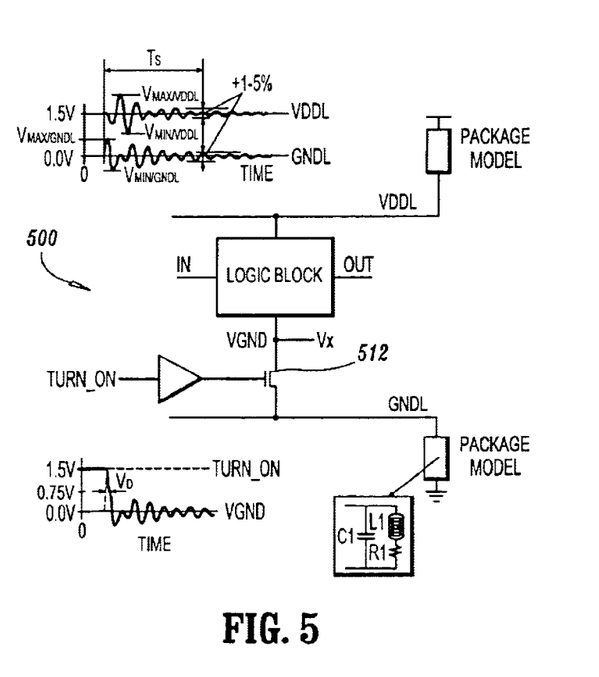
FIG. 5 is a simplified circuit model used to characterize the impact of ground bounce induced by power-mode transition of a power gate structure, qualitatively.

The impact of the ground bounce caused by a power-mode transition is qualitatively characterized below. To understand ground bounce caused by the power mode transition, a simplified circuit model of FIG. 5 is provided and analyzed qualitatively.

Ground bounce measurement is made by turning on the sleep transistor 512 of the power gate structure 500. The charge trapped in the capacitive loads and virtual ground (VGND) rail during the standby period is discharged rapidly. The noise voltage generated at the on-chip power supply (VDDL) and ground (GNDL) rails and the current through the package model inductor are measured.

$T_D$, $I_{MINISLEEP}$, $I_{MAXISLEEP}$, $V_{MINIVDDL}$, $V_{MAXIVDDL}$, $V_{MINIGNDL}$, $V_{MAXIGNDL}$, and $T_S$ are defined to characterize the ground bounce effect induced by the power-mode transition of the power gate structure.

$T_D$ is the time difference between 50% TURN-ON signal transistor and 50% VGND level. $I_{MINISLEEP}$ and $I_{MAXISLEEP}$ are the minimum and maximum current flow through the inductor of a package model, respectively. $V_{MINIVDDL}$ and $V_{MAXIVDDL}$ are the minimum and maximum level of voltage glitches on the $V_{DDL}$ rail, respectively. $V_{MINIGNDL}$ and $V_{MAXIGNDL}$ are the minimum and maximum level of voltage glitches on the GNDL rail, respectively. $T_S$ is the minimum time required for the $V_{DDL}$ and GNDL to be stabilized within ±5% of nominal. To guarantee correct operation of the logic parts with VDD and GND nodes connected to the VDDL and GNDL rails directly or through the turned-on sleep transistor, operation of the logic part should not be started for at least $T_S$.

Figure 6:
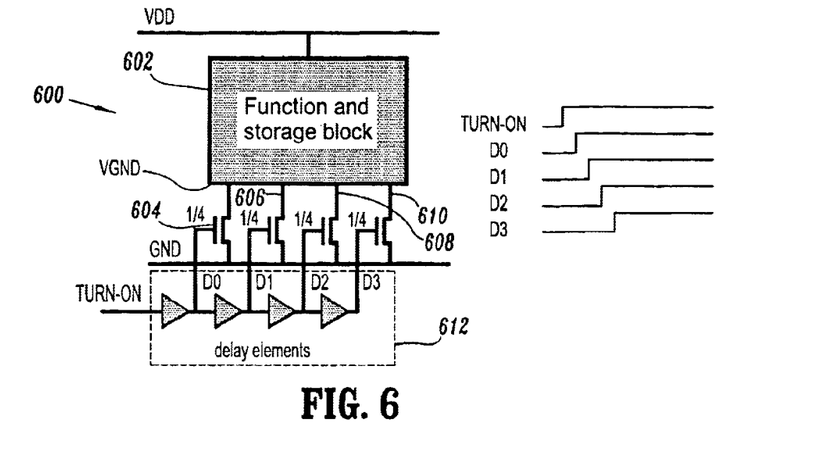
FIG. 6 is a schematic diagram of a power gate structure including a non-abrupt switching mechanism according to a first embodiment of the present invention.

FIG. 6 is a schematic diagram of a power gate structure 600 including a non-abrupt switching mechanism according to a first embodiment of the present invention.

The power gate structure 600 of FIG. 6 includes a supply voltage line VDD, a ground voltage line GND, a virtual ground voltage line VGND, a logic circuit 602 coupled to the supply voltage line VDD and the virtual ground voltage line VGND, a plurality of sleep transistors 604–610 for controlling current flow to the logic circuit 602, the sleep transistors 604–610 being coupled to the virtual ground voltage line VGND and the ground voltage line GND; and a stepwise switching circuit 612 for sequentially controlling the sleep transistors 604–610. The logic circuit 602 may contain any number of logic elements for performing a function of a semiconductor device or for storing data.

The switching circuit 612 includes a plurality of delay elements D0–D3. Each delay element corresponds to a single sleep transistor 604–610. As the semiconductor device goes into an active state, the TURN-ON signal goes to a high logic level and will be delayed at each delay element as to sequentially turn on each sleep transistor 604–610, as can be seen from the timing diagram to the right of circuit 600. The logic circuit 602 will not enter the active mode until all sleep transistors are turned on.

Figure 7:
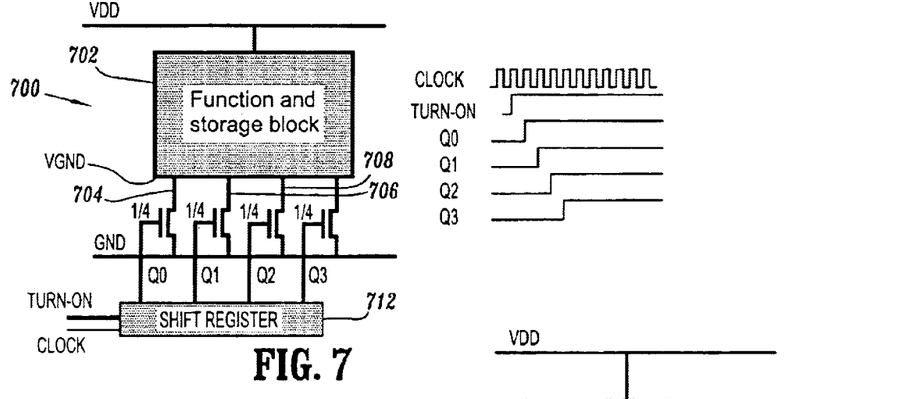
FIG. 7 is a schematic diagram of a power gate structure including a non-abrupt switching mechanism according to a second embodiment of the present invention.

FIG. 7 is a schematic diagram of a power gate structure including a non-abrupt switching mechanism according to a second embodiment of the present invention.

The power gate structure 700 of FIG. 7 includes a supply voltage line VDD, a ground voltage line GND, a virtual ground voltage line VGND, a logic circuit 702 coupled to the supply voltage line VDD and the virtual ground voltage line VGND, a plurality of sleep transistors 704–710 for controlling current flow to the logic circuit 702, the sleep transistors 704–710 being coupled to the virtual ground voltage line VGND and the ground voltage line GND; and a stepwise switching circuit 712 for sequentially controlling the sleep transistors 704–710. The logic circuit 702 may contain any number of logic elements for performing a function of a semiconductor device or for storing data.

The switching circuit 712 is a shift register including a plurality of outputs Q0–Q3. Each output Q0–Q3 corresponds to a single sleep transistor 704–710. As the semiconductor device goes into an active state, the TURN-ON signal goes to a high logic level and, at each subsequent clock cycle CLOCK, an output Q0–Q3 of the shift register 712 will turn on a corresponding sleep register, as can be seen from the timing diagram to the right of circuit 700. The logic circuit 702 will not enter the active mode until all sleep transistors are turned on.

Figure 8:
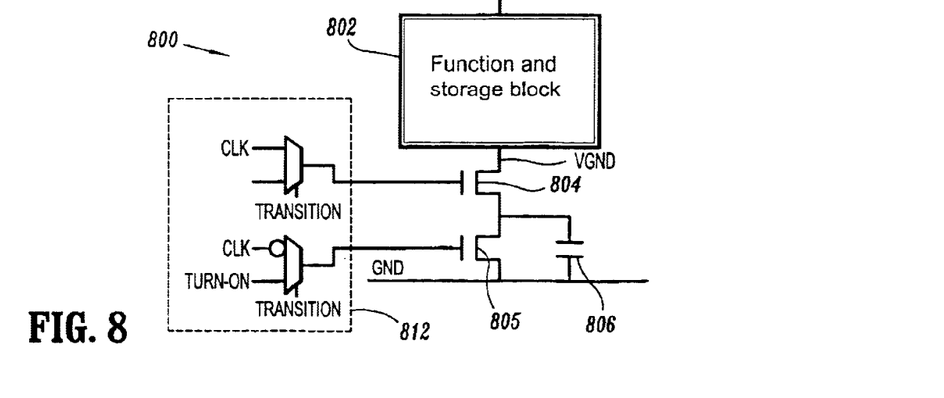
FIG. 8 is a schematic diagram of a power gate structure including a non-abrupt switching mechanism according to a third embodiment of the present invention.

FIG. 8 is a schematic diagram of a power gate structure including a non-abrupt switching mechanism according to a third embodiment of the present invention.

The power gate of structure 800 of FIG. 8 includes a supply voltage line VDD, a ground voltage line GND, a virtual ground voltage line VGND, a logic circuit 802 coupled to the supply voltage line VDD and the virtual ground line VGND, a series of sleep transistors 804 and 805 for controlling the current flow to the logic circuit of 802, the sleep transistors 804 and 805 being coupled to the virtual ground voltage line VGND and the ground voltage line GND, a discharge capacitor 806 connected to an intermediate node N1 between sleep transistors 804 and 805 and the ground voltage line GND; and a pulse generator circuit 812 for sequentially controlling sleep transistors 804 and 805 to incrementally transfer charge from the virtual ground line VGND to the discharge capacitor 806 via the transistor 804, then from the discharge capacitor 806 to the ground line GND via transistor 805.

When the TRANSITION signal is low, the TURN-ON signal is inputted to the sleep transistors 804 and 805. When the TURN-ON signal is low, both sleep transistors 804, 805 are off, blocking leakage current from discharging to the ground line GND. When the TURN-ON signal is high, both sleep transistors 804, 805 are on, and connect the virtual ground line VGND to the ground line GND. When TRANSITION signal is high the sleep transistor 804 receives the true form of the CLK signal and sleep transistor 805 receives the complement form the CLK signal. This will cause a clock controlled discharge of the virtual ground line VGND by selectively charge sharing between the capacitor 806 and the virtual ground line VGND or charge sharing between capacitor 806 and the ground line GND by transistors 804 and 805. The logic circuit of 802 may contain any number of logic elements for performing a function of a semiconductor device or for storing data.

Figure 9:
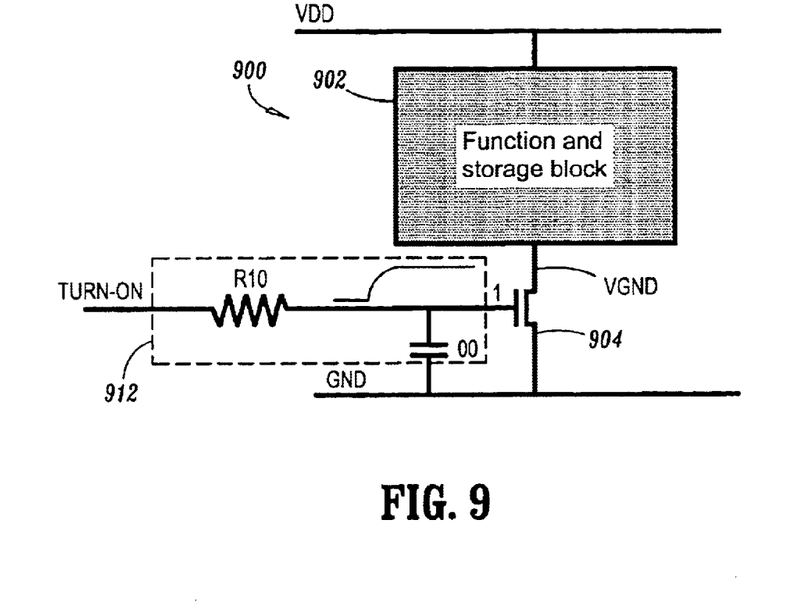
FIG. 9 is a schematic diagram of a power gate structure including a non-abrupt switching mechanism according to a fourth embodiment of the present invention.

FIG. 9 is a schematic diagram of a power gate structure 900 including a non-abrupt switching mechanism according to a fourth embodiment of the present invention.

The power gate structure 900 of FIG. 9 includes a supply voltage line VDD, a ground voltage line GND, a virtual ground voltage line VGND, a logic circuit 902 coupled to the supply voltage line VDD and the virtual ground voltage line VGND, a sleep transistor 904 for controlling current flow to the logic circuit 902, the sleep transistor 904 being coupled to the virtual ground voltage line VGND and the ground voltage line GND; and a switching circuit 912 for sequentially controlling the sleep transistor 904. The logic circuit 902 may contain any number of logic elements for performing a function of a semiconductor device or for storing data.

The switching circuit 912 includes a resistor RIO connected in series between the TURN-ON signal and the gate of the sleep transistor 904 and a capacitor C10 connected in series between GND and the gate of the sleep transistor 904. As the semiconductor device goes into an active state, the TURN-ON signal goes to a high logic level and gradually charges the capacitor C10 until it reaches the threshold voltage of the sleep transistor 904 turning the sleep transistor 904 on. The logic circuit 902 will not enter the active mode until the sleep transistor is turned on.

Figure 10:
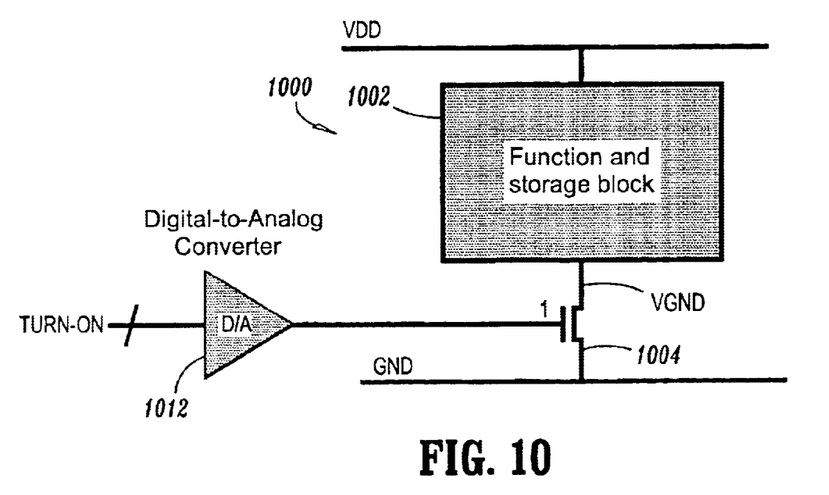
FIG. 10 is a schematic diagram of a power gate structure including a non-abrupt switching mechanism according to a fifth embodiment of the present invention.

FIG. 10 is a schematic diagram of a power gate structure 1000 including a non-abrupt switching mechanism according to a fifth embodiment of the present invention.

The power gate structure 1000 of FIG. 10 includes a supply voltage line VDD, a ground voltage line GND, a virtual ground voltage line VGND, a logic circuit 1002 coupled to the supply voltage line VDD and the virtual ground voltage line VGND, a sleep transistor 1004 for controlling current flow to the logic circuit 1002, the sleep transistor 1004 being coupled to the virtual ground voltage line VGND and the ground voltage line GND; and a switching circuit 1012 for sequentially controlling the sleep transistor 1004. The logic circuit 1002 may contain any number of logic elements for performing a function of a semiconductor device or for storing data.

The switching circuit 1012 is a digital-to-analog converter D/A. As the semiconductor device goes into an active state, individual bits of the TURN-ON signal goes to a high logic level over a period of time and gradually the voltage output from the digital-to-analog converter D/A 1012 increases until it reaches the threshold voltage of the sleep transistor 1004 turning the sleep transistor 1004 on. The logic circuit 1002 will not enter the active mode until the sleep transistor is turned on.

Figure 11:
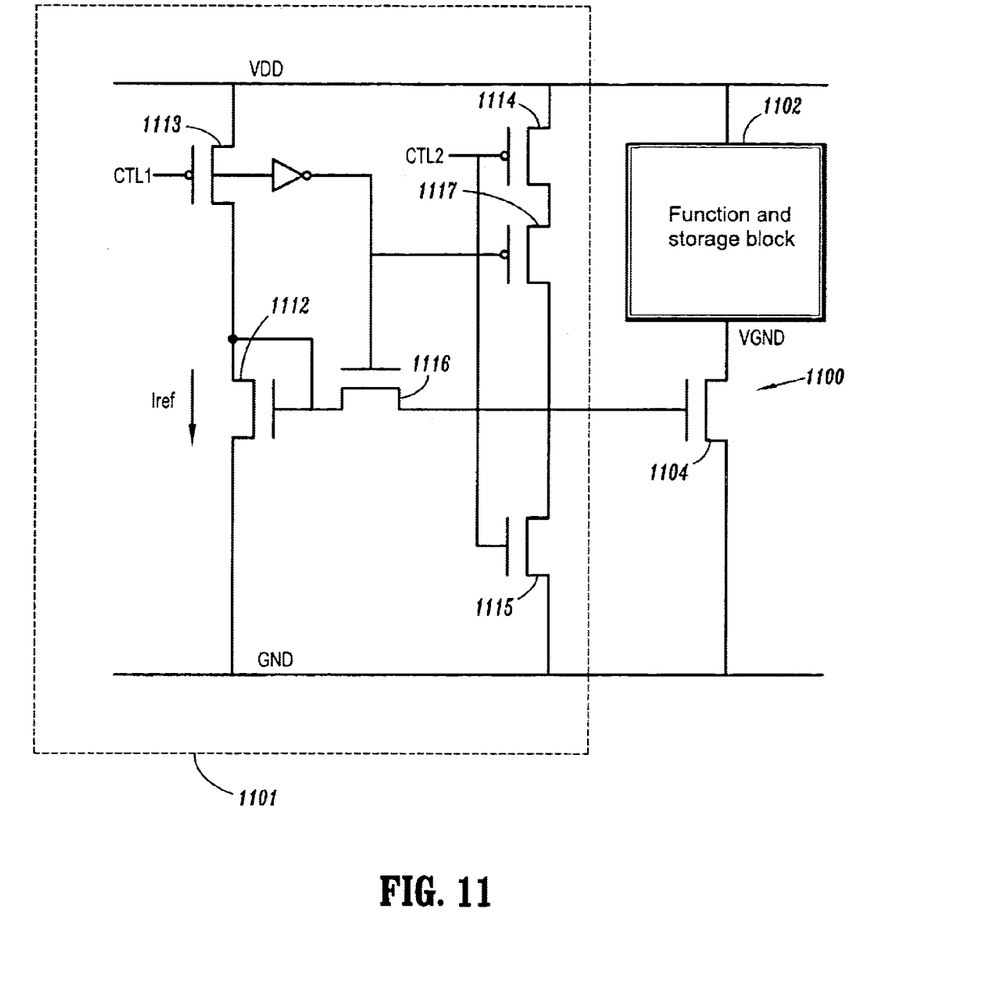
FIG. 11 is a schematic diagram of a power gate structure including a non-abrupt switching mechanism according to a sixth embodiment of the present invention.

FIG. 11 is a schematic diagram of a power gate structure 1100 including a non-abrupt switching mechanism according to a sixth embodiment of the present invention.

The power gate structure 1100 of FIG. 11 includes a supply voltage line VDD, a ground voltage line GND, a virtual ground voltage line VGND, a logic circuit 1102 coupled to the supply voltage line VDD and the virtual ground voltage line VGND, a sleep transistor 1104 for controlling current flow to the logic circuit 1102, the sleep transistor 1104 being coupled to the virtual ground voltage line VGND and the ground voltage line GND; and a switching circuit 1101 for sequentially controlling the sleep transistor 1104. The logic circuit 1102 may contain any number of logic elements for performing a function of a semiconductor device or for storing data.

The switching circuit 1101 is comprised of transistor 1112 with its drain tied to its gate, transistor 1113 with a first input control signal CTL1, transistors 1114, 1115 with a second input control signal CTL2, and transistors 1116, 1117 with the complement of the control signal CTL1. When the semiconductor device is in an inactive state, control signals CTL1 and CTL2 are at a high logic level. When the semiconductor device goes into an active state, first control signal CTL1 and second control signal signal CTL2 simultaneously go to a low logic level. A reference current, Iref, is set by the circuit and a ratio of this current is set in transistor 1104. This current is set to be sufficiently small as to not cause ground bounce and is maintained until the charge remaining in the function and storage block 1102 is sufficiently reduced to avoid ground bounce. After that time, the first control signal CTL1 goes to a high logic level. The logic circuit 1102 will not enter the active mode until CTL1 goes to a low logic level and CTL2 goes to a high logic level. This is only one example of a current mirror and bypass switch that implements the intended function of the embodiment shown in FIG. 11. It is to be appreciated by those skilled in the art that numerous alternative implementations may be configured.

A non-abrupt switching mechanism for reducing ground bounce caused by discharge current through a sleep transistor during the power-mode transition of a power gate structure is described. Ground bounce reduction techniques are provided to reduce the magnitude of voltage glitches in the supply voltage VDD and ground voltage GND rails as well as the time required for these rails to stabilize.

In an alternate embodiment, the present invention may be applicable to power gate structures in which the sleep transistor is coupled to the supply voltage line and the virtual supply voltage line. The present invention may also be applicable to power gate structures with two sleep transistors in which one sleep transistor is coupled to the virtual ground voltage line and the ground voltage line and the other sleep transistor is coupled to the supply voltage line and the virtual supply voltage line.

While the invention has been shown and described with reference to certain preferred embodiments thereof, it will be understood by those skilled in the art that various changes in form and detail may be made therein without departing from the spirit and scope of the invention as defined by the appended claims.

What is claimed is:

1. A semiconductor integrated circuit comprising:
   a supply voltage line;
   a ground voltage line;
   a virtual ground voltage line;
   a logic circuit coupled to the supply voltage line and the virtual ground voltage line;
   at least one sleep transistor for controlling current flow to the logic circuit, the sleep transistor being coupled to the virtual ground voltage line and the ground voltage line; and
   a non-abrupt switching circuit for controlling the at least one sleep transistor to control the rate of change of the current flow to the logic circuit over a period of time.

2. The semiconductor integrated circuit as in claim 1, further comprising a plurality of sleep transistors, wherein the switching circuit includes a plurality of delay elements, each delay element corresponding to each sleep transistor.

3. The semiconductor integrated circuit as in claim 1, further comprising a plurality of sleep transistors, wherein the switching circuit is a shift register having a plurality of outputs corresponding to each of the sleep transistors.

4. The semiconductor integrated circuit as in claim 1, wherein the switching circuit is a pulse generator.

5. The semiconductor integrated circuit as in claim 4, comprising at least two sleep transistors connected in series and a discharge capacitor coupled at an intermediate node between the at least two sleep transistors, wherein the pulse generator sequentially controls the at least two sleep transistors.

6. The semiconductor integrated circuit as in claim 1, wherein the switching circuit includes a resistor and capacitor connected in parallel.

7. The semiconductor integrated circuit as in claim 1, wherein the switching circuit is a digital-to-analog converter.

8. The semiconductor integrated circuit as in claim 1, wherein the switching circuit is a current mirror.

9. In a semiconductor integrated circuit including a supply voltage line, a ground voltage line, a virtual ground voltage line, a logic circuit coupled to the supply voltage line and the virtual ground voltage line, a method for controlling current flow to
   the logic circuit during an active and standby mode, the method comprising the steps of:
   providing a sleep transistor coupled to the virtual ground voltage line and the ground voltage line for controlling current flow to the logic circuit; and
   controlling the sleep transistor over a period of time to non-abruptly set the logic circuit to the active mode.

10. The method of claim 9, wherein the controlling step is performed by a switching circuit.

11. The method of claim 10, wherein the semiconductor integrated circuit further comprising a plurality of sleep transistors, wherein the switching circuit includes a plurality of delay elements, each delay element corresponding to each sleep transistor.

12. The method of claim 10, wherein the semiconductor integrated circuit further comprising a plurality of sleep transistors, wherein the switching circuit is a shift register having a plurality of outputs corresponding to each of the sleep transistors.

13. The method as in claim 10, wherein the switching circuit is a pulse generator.

14. The method as in claim 13, wherein the semiconductor integrated circuit comprises at least two sleep transistors connected in series and a discharge capacitor coupled at an intermediate node between the at least two sleep transistors, wherein the pulse generator sequentially controls the at least two sleep transistors.

15. The method as in claim 10, wherein the switching circuit includes a resistor and capacitor connected in parallel.

16. The method as in claim 10, wherein the switching circuit is a digital-to-analog converter.

17. The method as in claim 10, wherein the switching circuit is a current motor.

* * * * *